United States Patent [19]
Tokuyama

[11] Patent Number: 5,182,559
[45] Date of Patent: Jan. 26, 1993

[54] DIGITAL-ANALOG CONVERTER WITH PLURAL COEFFICIENT TRANSVERSAL FILTER

[75] Inventor: Takashi Tokuyama, Iwaki, Japan

[73] Assignee: Alpine Electronics, Inc., Tokyo, Japan

[21] Appl. No.: 795,245

[22] Filed: Nov. 15, 1991

Related U.S. Application Data

[63] Continuation of Ser. No. 557,433, Jul. 23, 1990.

[30] Foreign Application Priority Data

Jul. 28, 1989 [JP] Japan .................................. 1-195724

[51] Int. Cl.$^5$ ..................... H03M 1/66; G06F 15/353
[52] U.S. Cl. ................................ 341/144; 364/724.16
[58] Field of Search ............... 341/144, 126, 127, 146, 341/147, 152, 153; 364/724.16

[56] References Cited

U.S. PATENT DOCUMENTS

| | | | |
|---|---|---|---|
| 3,500,215 | 3/1970 | Leuthold et al. | 341/144 |
| 3,543,009 | 11/1970 | Voelcker, Jr. | 341/153 X |
| 3,793,589 | 2/1974 | Puckette | 341/147 X |
| 4,096,475 | 6/1978 | Ong | 341/152 X |
| 4,499,594 | 2/1985 | Lewinter | 341/126 X |
| 4,542,369 | 9/1985 | Kasuga | 341/144 |
| 4,573,188 | 2/1986 | Lewinter | 341/144 |
| 4,580,128 | 4/1986 | Ogita et al. | 341/144 |
| 4,614,934 | 9/1986 | Kobayashi et al. | 341/144 |
| 4,620,158 | 10/1986 | Yasukawa | 360/32 X |
| 4,682,149 | 7/1987 | Larson | 341/153 X |
| 4,782,324 | 11/1988 | Underwood | 341/147 |
| 4,862,170 | 8/1989 | Hashimoto et al. | 341/144 |
| 4,897,654 | 1/1990 | Mori et al. | 341/147 |
| 4,973,977 | 11/1990 | Hawkins et al. | 341/144 |
| 4,992,792 | 2/1991 | Mori et al. | 341/147 |
| 5,111,417 | 5/1992 | Belloc et al. | 364/724.16 |

OTHER PUBLICATIONS

Analog Devices Inc., Analog-Digital Conversion Handbook, 1986, pp. 628-631, 649-650.

*Primary Examiner*—Howard L. Williams
*Attorney, Agent, or Firm*—Guy W. Shoup; Norman R. Klivans

[57] ABSTRACT

A digital-to-analog converter which is especially suitable for use in converting digital audio data into an analog signal includes a partial signal time series data generating section for dividing a unit pulse response signal into m partial signals at a predetermined time interval T before digitally and repeatedly generating each partial signal with n items of time series numerical value data, a digital data storing section for storing m items of the latest digital data generated at the predetermined time T, a digital computing section for multiplying the time series numerical value data of each partial signal by digital data stored in the storing section corresponding to the partial signal before adding the multiplication results, and a converter for converting digital numerical value data which is the output from the digital computing section into an analog.

10 Claims, 9 Drawing Sheets

DIGITAL-ANALOG CONVERTER WITH PLURAL COEFFICIENT TRANSVERSAL FILTER

This application is a continuation of application Ser. No. 07/557,433, filed Jul. 23, 1990.

BACKGROUND OF THE INVENTION

1. Field of the Invention

The present invention relates to a digital-analog converter, and more particularly to a digital-analog converter suitable for use in converting digital audio data into an analog signal.

2. Description of the Related Art

In compact disc players (DC players) or digital tape recording/playback devices (DAT devices), digital audio signals are converted into analog signals prior to output from speakers.

In commonly employed digital-analog converters (hereinafter referred to as DA converters) for music playback, digital data is converted into a direct current and the direct current is converted into voltage at every sampling period to be held. The held voltage is shaped by a low-pass filter into a continuous, smooth analog signal before being outputted. The foremost problem encountered in such DA converters as mentioned above is phase distortion ascribable to the low-pass filter, causing a deterioration in sound quality.

To overcome the above problem, the present and other inventors have proposed a DA converter shown in FIG. 10 in Japanese Patent Application No. 62-78878 corresponding to U.S. Pat. No. 4,862,170. This DA converter includes a digital data generator 10 for generating digital data at every predetermined time T, a digital data storing section 11 comprised of shift registers ($11_{-4}$ through $11_{+4}$) for storing, by successively shifting, m items of the latest digital data $V_{-4}$ through $V_{+4}$ generated at every predetermined time T, a unit pulse response signal generator 12 comprised of partial signal generators ($12_{-4}$ through $12_{+4}$) for dividing a unit pulse response signal SP (see FIG. 11) at a predetermined time interval T and for repeatedly generating at every time T m partial analog signals $S_{-4}$ through $S_{+4}$ (see FIG. 12) which have been divided, a multiplier 13 having multiplying-type DA converters ($13_{-4}$ through $13_{+4}$) for multiplying partial signals Si by predetermined digital data Vi stored in the shift registers corresponding to the partial signals Si, and a mixer 14 for outputting an analog signal by combining the output voltage of the multiplying-type DA converters.

According to the above-mentioned method, without utilizing a low-pass filter, a pulse response signal permits smooth compensation for a gap between digital data at a period T, thereby generating a continuous analog signal that is free of phase distortion.

There are, however, problems in the DA converter shown in FIG. 10 in that it requires a digital storing section, m analog partial signal generators, m multiplying-type DA converters, and analog mixers, causing largeness in size, an increased number of parts, and it is not suitable to miniaturize the converter. Further, because of the largeness in size, an increased number of parts and special IC chips for the multiplying-type DA converters, the DA converter becomes considerably expensive.

Furthermore, since there are a number of adjusting points because of changes in volume in the multiplying-type converters and analog partial signal generators, it requires skill to adjust the points. It is troublesome to carry out re-adjustments caused by deterioration with age and to re-adjust the points when unit pulse response signal waveforms are altered.

Moreover, the adjusting points deviate with temperature, and it is far more troublesome to adjust the points strictly in accordance with temperature.

In addition, since a number of parts, with a wide range of variability, such as a capacitor, are utilized in the partial signal generators and the multiplying-type DA converters, variability is likely to occur. This leads to a problem in that extremely small spike-like noises are imprinted onto an analog signal.

SUMMARY OF THE INVENTION

In view of the foregoing, an object of the present invention is to provide a DA converter which permits minimizing an analog circuit having a number of adjusting points and variability.

Another object of the present invention is to provide a DC converter in which a gap between input digital data is compensated for with a plurality of digital data, and the compensated data is DA-converted before a continuous analog signal is outputted.

A further object of the present invention is to provide a DA converter in which the continuous analog signal of input digital data is outputted in such a manner that unit pulse response signals are digitally generated, and at the same time a gap between inputted digital data is digitally compensated for by using the unit pulse response signal data before the compensated data is DA-converted.

The present invention overcomes the aforesaid problems by providing a partial signal time series data generating section for digitally and repeatedly generating, by means of time series numerical value data, each partial signal of unit pulse response signals, a digital data storing section for successively storing m items of the latest digital data, a digital computing section, and a converter for converting output data from the digital computing section into an analog signal.

A unit pulse response signal is converted into an analog signal in such a way that the unit pulse response signal is divided into m partial signals at a predetermined time interval T. Each of the partial signal is digitally and repeatedly generated by means of n items of time series numerical value data, and at the same time m items of the latest digital data generated at every time interval T are successively stored. The time series numerical value data of each partial signal is multiplied by the digital data corresponding to the partial signal before the multiplication results are added.

Other features and advantages of the present invention will be apparent from the following description taken in conjunction with the accompanying drawings, in which like reference characters designate the same or similar parts through the figures thereof.

DESCRIPTION OF THE PREFERRED EMBODIMENT

Figure 1:
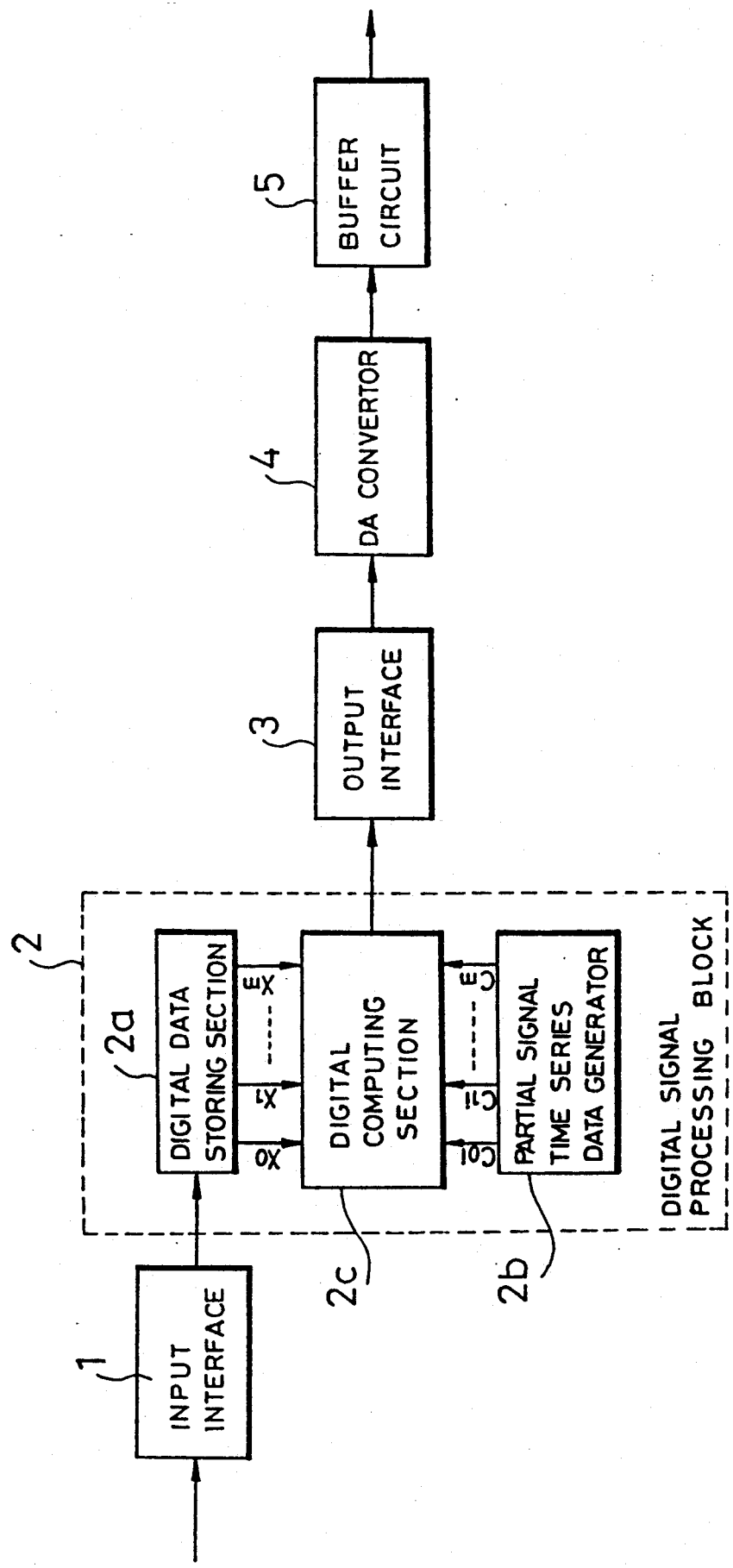
FIG. 1 is a block diagram of a DA converter according to the present invention.

FIG. 1 is a block diagram illustrating a DA converter according to the present invention. Numeral 1 denotes a digital input interface circuit for outputting digital audio data from CD players, DAT devices or satellite broadcasting tuners (not shown), after converting the data into a form which can be processed at a post-stage for an L-channel and an R-channel, respectively. Numeral 2 denotes a digital signal processing block; for example, a digital signal processor (DSP) digitally compensates for a gap between data inputted at a sampling period T. Numeral 3 denotes a digital output interface, numeral 4 denotes a DA converter which DA-converts compensated data outputted from the digital signal processing block 2, while numeral 5 denotes a buffer circuit. Although the digital signal processing block 2, the digital output interface circuit 3, the DA converter 4, and the buffer circuit 5 may be provided for the L channel and the R channel, respectively, FIG. 1 shows the respective components for only one channel.

The digital signal processing block 2 includes a digital data storing section 2a for storing, while shifting, the latest m items of digital data Xi (x=1 through m) generated at every predetermined time interval T, a partial signal time series data generator 2b for dividing a unit pulse response signal into (m+1) partial signals at a predetermined time interval T, and for digitally and repeatedly generating partial signals SPj (j=0 through m) as n items of time series numerical value data at every sampling period T/n in accordance with the following table, and a digital computing section 2c for multiplying time series numerical value data of each partial signal outputted from the partial signal time series data generator 2b by digital data corresponding to the partial signal, before adding the multiplication results.

TABLE

| Partial | Time series numerical value data | | | | |
|---|---|---|---|---|---|
| Signal | T/n | 2T/n | 3T/n | ... | nT/n |
| SP0 | $C_{01}$ | $C_{02}$ | $C_{03}$ | ... | $C_{0n}$ |
| SP1 | $C_{11}$ | $C_{12}$ | $C_{13}$ | ... | $C_{1n}$ |
| SP2 | $C_{21}$ | $C_{22}$ | $C_{23}$ | ... | $C_{2n}$ |
| SP3 | $C_{31}$ | $C_{32}$ | $C_{33}$ | ... | $C_{3n}$ |
| ... | ... | ... | ... | ... | ... |
| SPm | $C_{m1}$ | $C_{m2}$ | $C_{m3}$ | ... | $C_{mn}$ |

The partial signal time series data generator 2b includes a memory for storing the numerical values in the above table, and a reading section which reads, at every T/n, numerical value data $C_{0i}, C_{1i}, C_{2i}, C_{3i}, \ldots, C_{mi}$ of each partial signal SPj (j=0 through m) at a predetermined time T·i/n (i=1,2, ... n) and which inputs the data to the digital computing section 2c.

Figure 2:
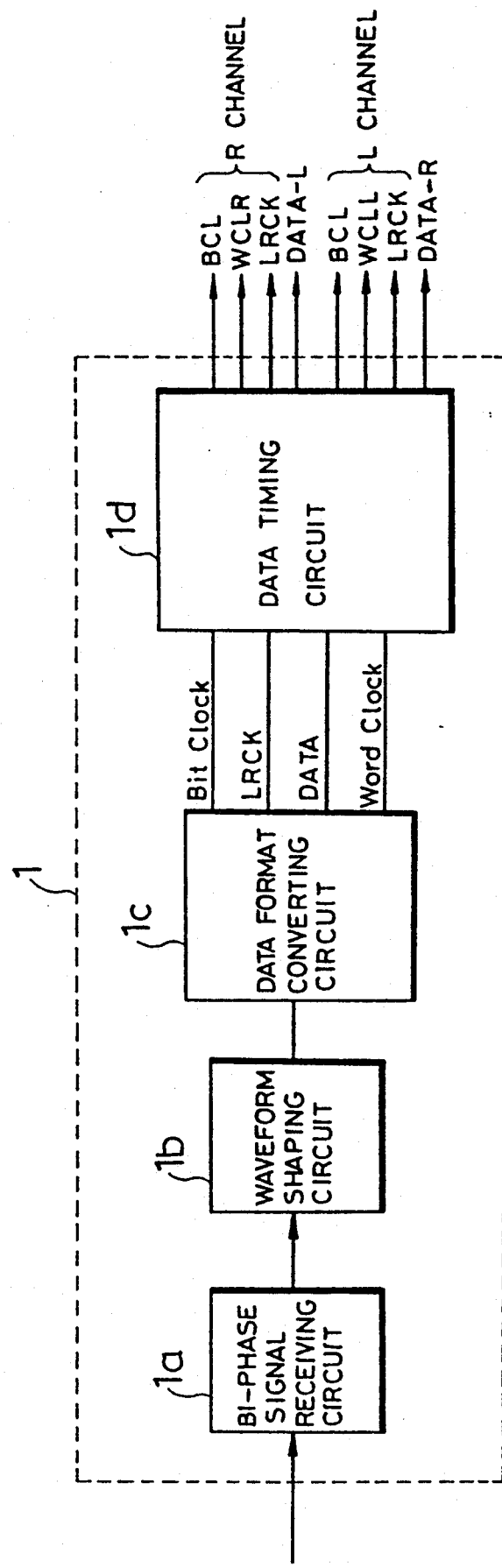
FIG. 2 is a block diagram illustrating a digital input interface circuit.

The digital input interface circuit 1 includes, as shown in FIG. 2, a bi-phase signal receiving circuit 1a for receiving bi-phase modulated data series, a waveform shaping circuit 1b for waveform-shaping bi-phase modulated data, a data format converting circuit 1c for converting the bi-phase data into a format which can be processed at a post-stage after demodulating the data in order to output the data, and a data timing circuit 1d for outputting a bit clock BCL, a word clock WCL, a channel clock LRCK, and data (L-channel data and R-channel data) for the respective L and R channels.

Figure 3:
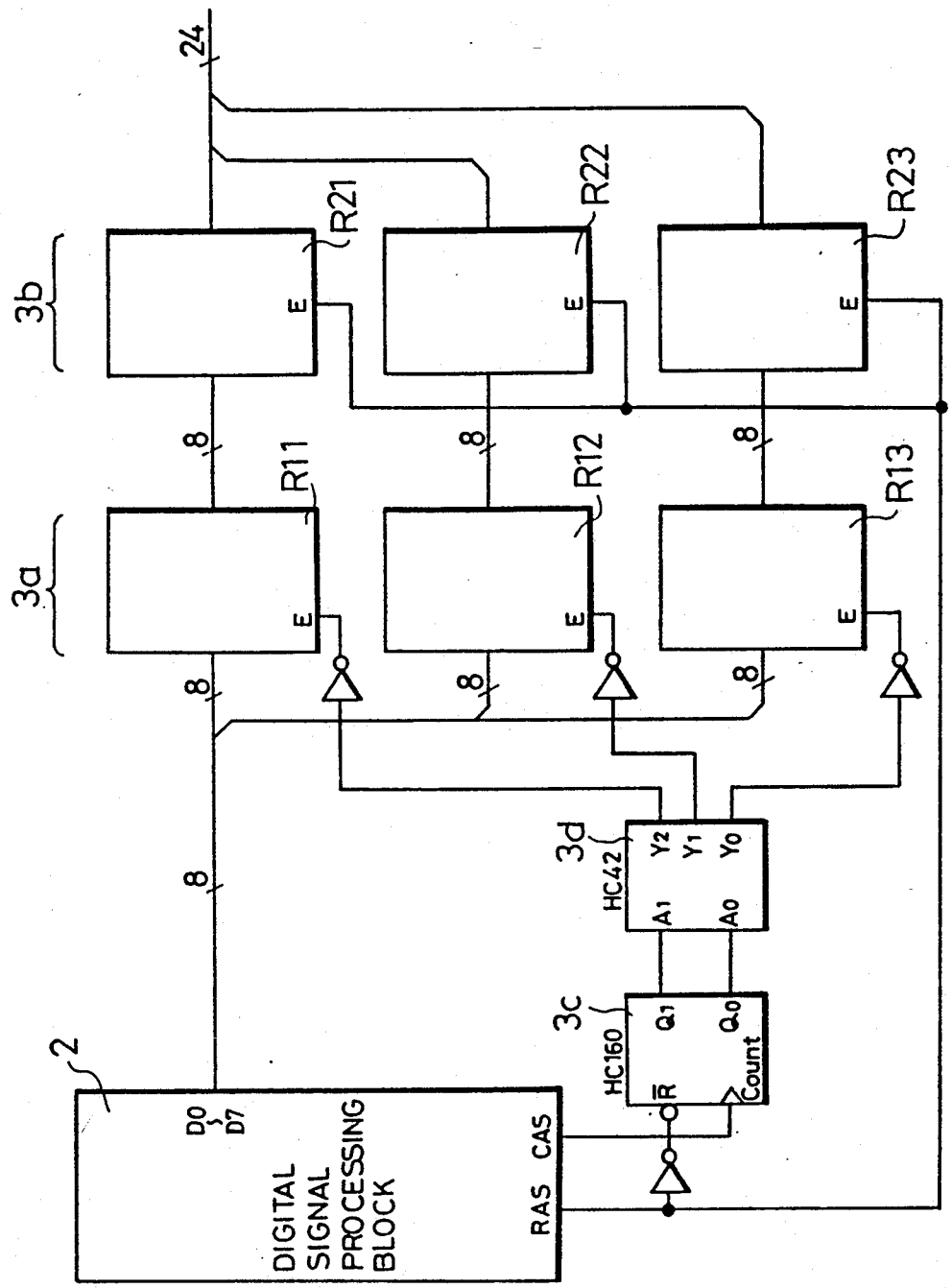
FIG. 3 is a block diagram illustrating a digital output interface circuit.

The digital output interface circuit 3 includes, as illustrated in FIG. 3, two-stage data buffer circuits 3a, 3b, a ternary counter 3c and a decoder 3d. Each of the data buffer circuits has three registers R11–R13 and R21–R23, and each of the registers is made up of eight bits. The counter 3c counts one digit each time an 8-bit data item is inputted, whereas the decoder 3d decodes the counted values, indicating the registers R11–R13 in which the 8-bit input data is to be stored. Data inputted in an 8-bit unit from the digital signal processing block 2 is processed, such that it is successively stored in the registers R11, R12, R13 of the data buffer circuit 3, and at the same time 24-bit data stored in the data buffer circuit 3a is shifted in parallel to the buffer circuit 3b at the next stage. The 24-bit data is outputted from the data buffer circuit 3b to a DA converter 4 (see FIG. 1), and at the same time the next data is inputted to the data buffer circuit 3a at the pre-stage.

Figure 4:
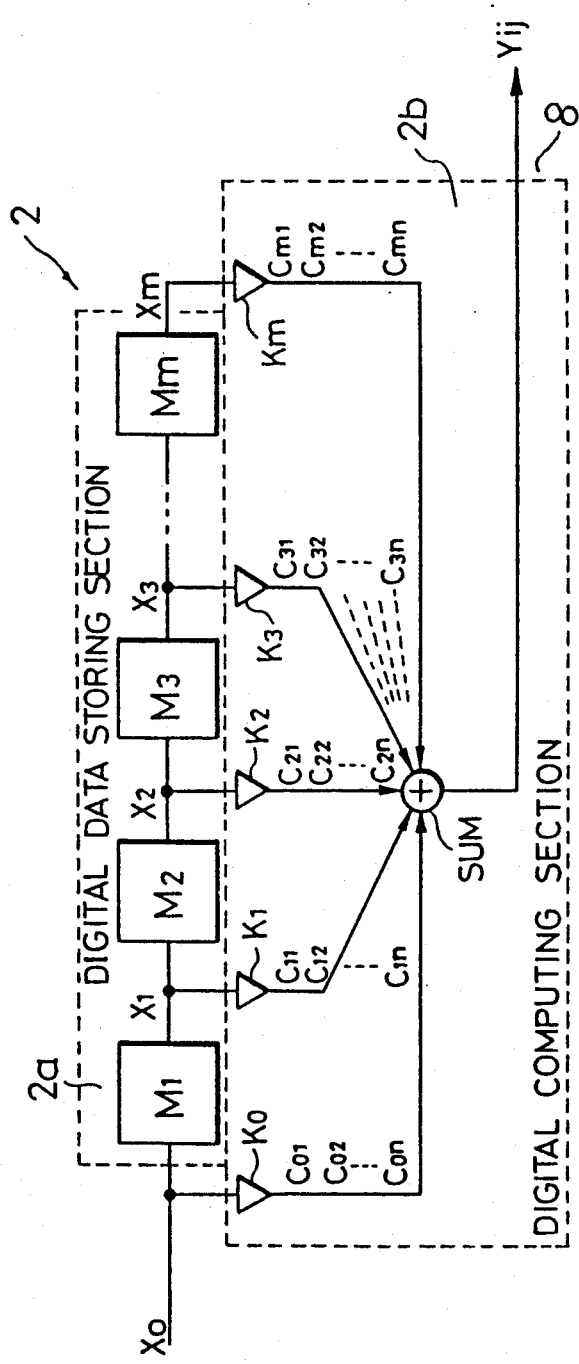
FIG. 4 is a schematic diagram showing a digital signal processing block 2.
Figure 5:
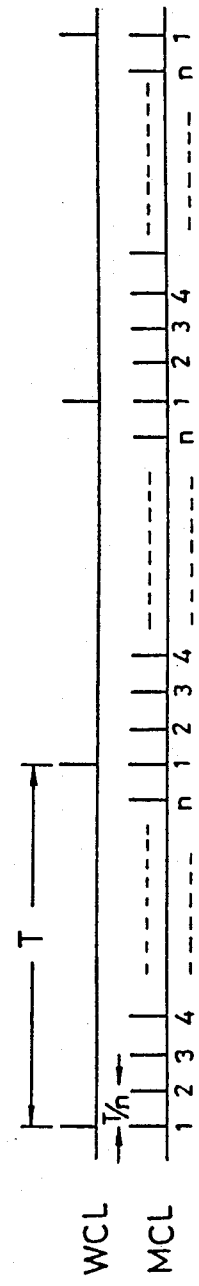
FIG. 5 is a time chart for clocks.

FIG. 4 is a schematic diagram showing the digital signal processing block 2; FIG. 5 is a time chart illustrating a word clock WCL for shifting data, and a clock MCL showing the timing for reading and multiplying time series numerical value data.

In FIG. 4, M1 through Mm indicate shift registers which store, while successively shifting, m items of the latest digital data Xi generated at every time interval T, and K0 through Km indicate multipliers which multiply, at every time T/n, time series numerical value data $C_{0i}, C_{1i}, C_{2i}, C_{3i}, \ldots, C_{mi}$ at a predetermined time T·i/n of each partial signal SPj (J=0 through m) by digital data X0 through Xm stored in the shift registers corresponding to the partial signals. SUM indicates an adder for adding the multiplication results, and the adder outputs at every time T/n the numerical value data that is expressed in the following equation:

$$Y_i = \sum_{i=1}^{n} \sum_{j=0}^{m} (C_{ji} \cdot X_j)$$

Figure 6:
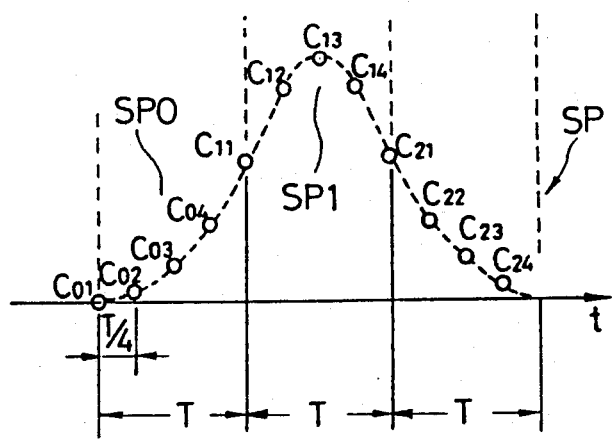
FIG. 6 is a view explaining time series numerical value data of a unit pulse response signal.

Accordingly, in FIG. 4, on the assumption that n=4, m=2, and four items of the time series numerical value data of three partial signals SP0 through SP2 are expressed as follows:

| SP0: | $C_{01}, C_{02}, C_{03}, C_{04}$ |
| SP1: | $C_{11}, C_{12}, C_{13}, C_{14}$ |
| SP2: | $C_{21}, C_{22}, C_{23}, C_{24}$, | the time series data of the unit pulse response signals shown in FIG. 6 is obtained by inputting a single item of unit digital data.

Figure 7:
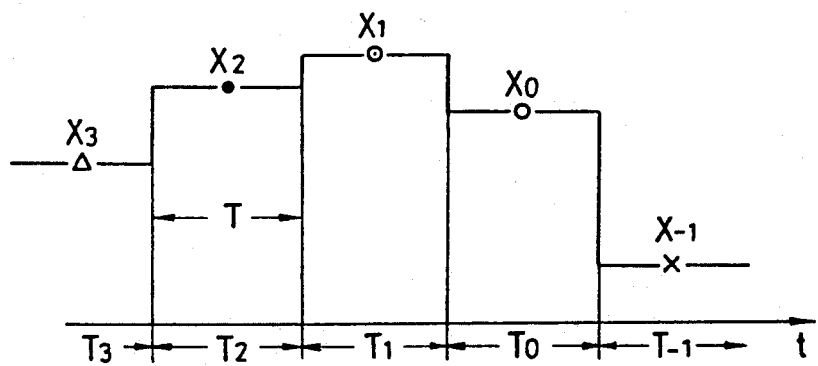
FIG. 7 is a view for digital data series.
Figure 8:
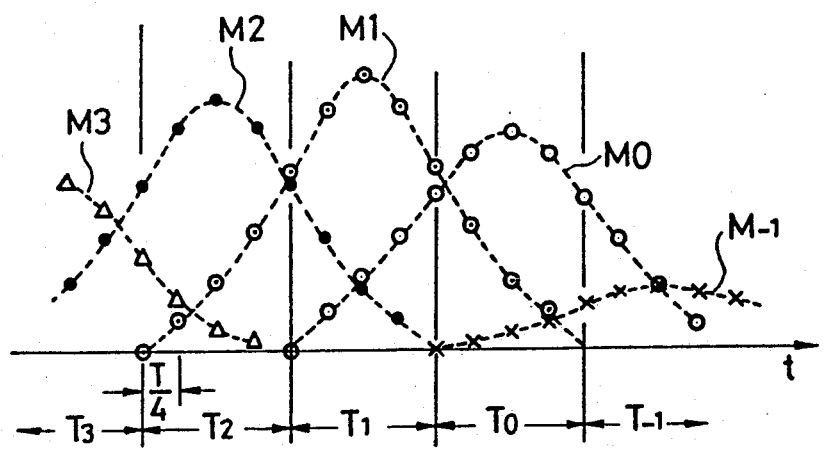
FIG. 8 is a view showing time series numerical value data series of a pulse response signal with respect to each item of digital data.

FIG. 7 is a view for digital data series; FIG. 8 is a view showing data series of a pulse response signal with respect to each item of digital data; and FIG. 9 is a view explaining the time axis of the time slot $T_1$ of FIG. 8 by expanding the axis.

On the assumption that digital data at each time slot Ti of a time span T is Xi as shown in FIG. 7, a continuous time signal with respect to the digital data is obtained by superposing, along the time axis, pulse response signals weighted by each item of the digital data Xi inputted from one moment to the next.

Figure 9:
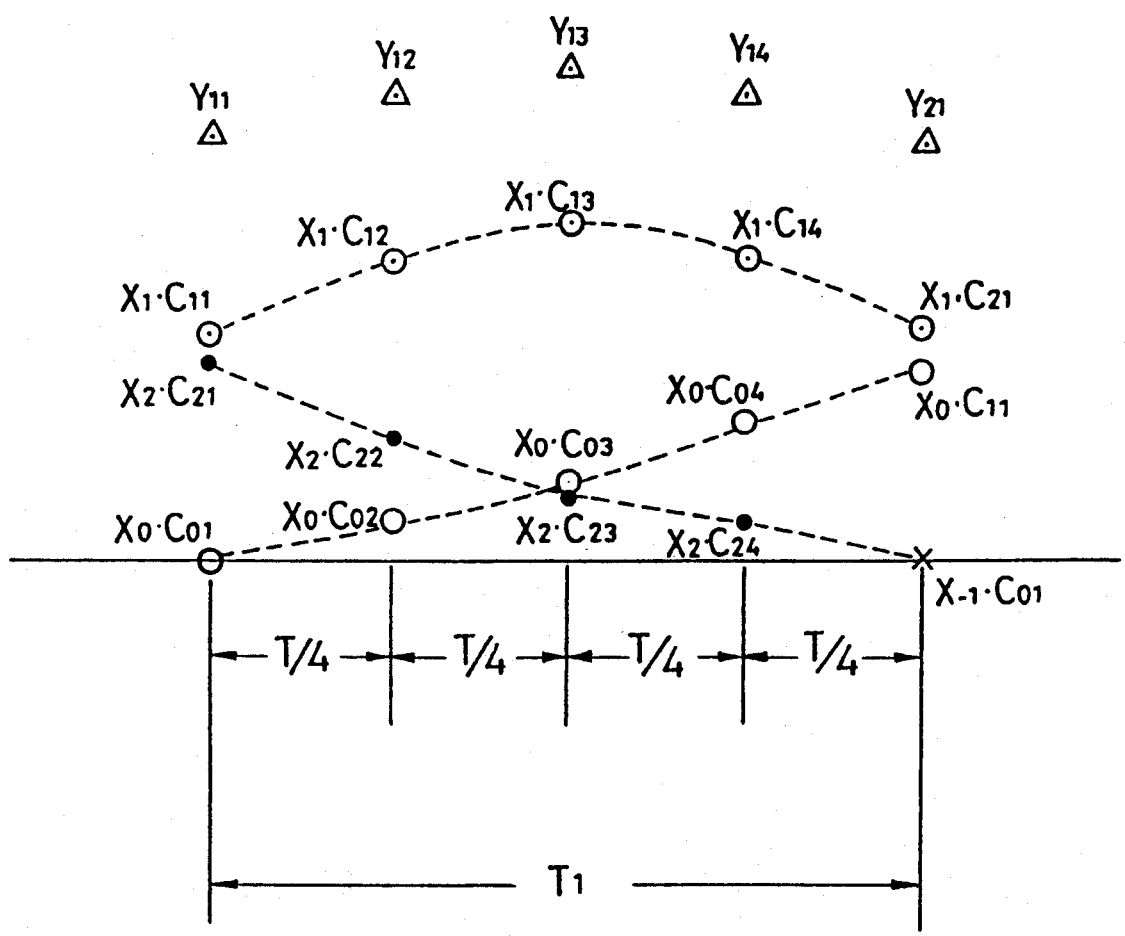
FIG. 9 is a view explaining the time axis of a time slot $T_1$ by expanding the axis.
Figure 10:
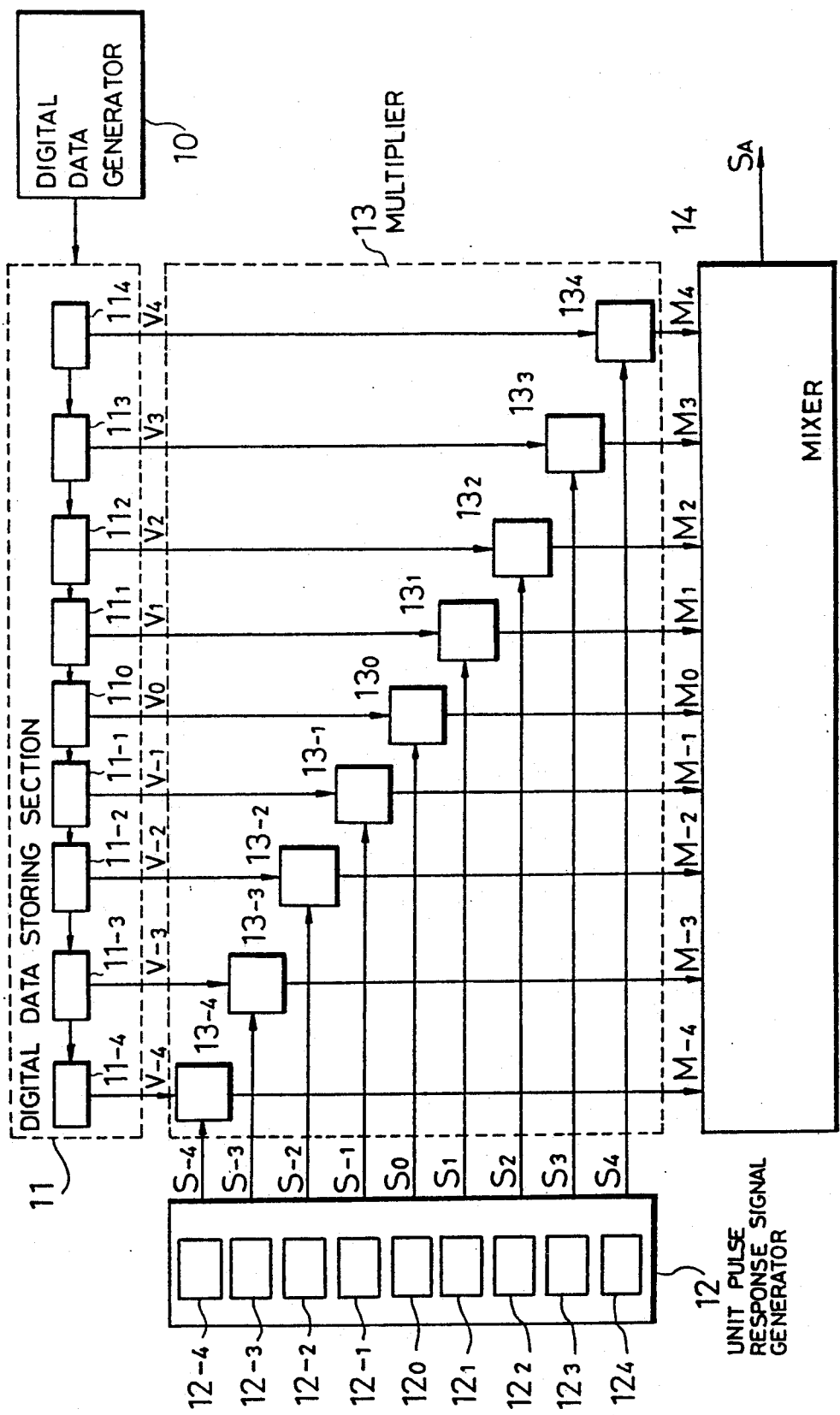
FIG. 10 is a block diagram showing a conventional DA converter.
Figure 11:
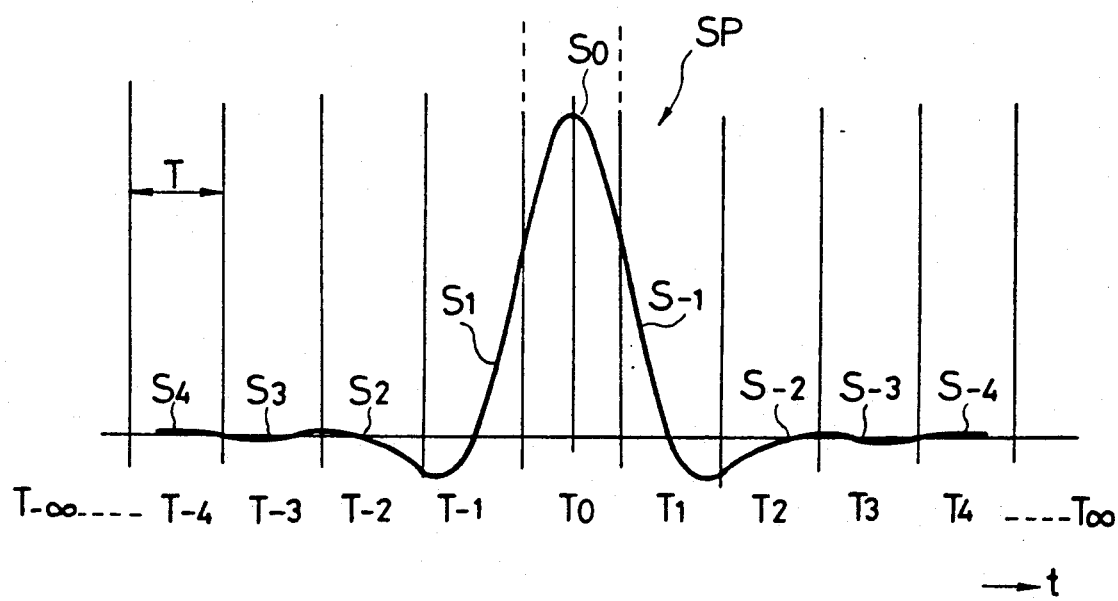
FIG. 11 is a waveform diagram of a unit pulse response signal.
Figure 12A:
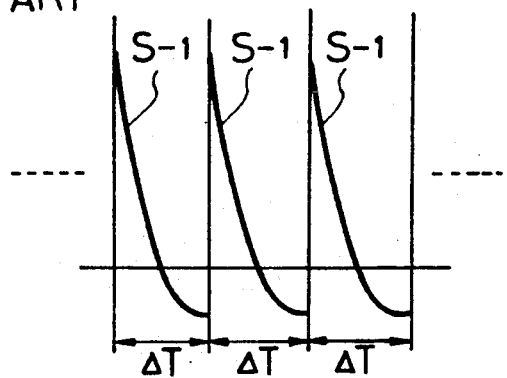
FIG. 12a–c a waveform diagram of a partial signal.
Figure 12B:
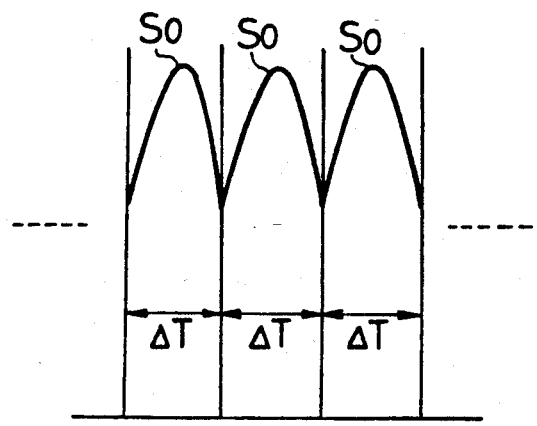
Figure 12C:
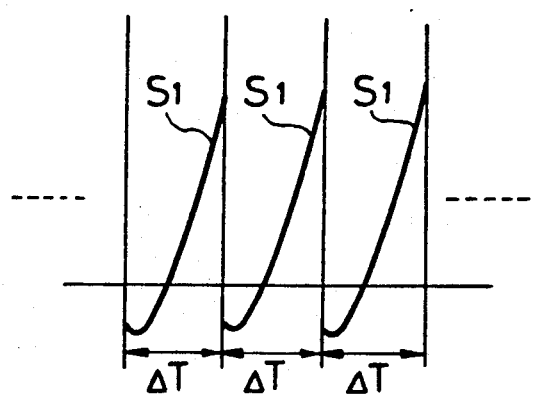

Data series Mi of the pulse response signal with respect to each item of the digital data Xi is, as illustrated in FIG. 8, the result of multiplying the time series numerical value data (FIG. 6) of a unit pulse response signal by Xi times, so that when the data series is successively combined at every time T/4, it is formed into $Y_{11}$ through $Y_{14}$ as shown in FIG. 9, allowing four items of digital data to be inserted into the time span T.

Further, on the assumption that at time slot T1 digital data X0 occurs, and at this time two items of digital data X1, X2 are stored in the shift registers M1, M2 of FIG. 4, time series numerical value data $$C_{01}, C_{11}, C_{21},$$
$$C_{02}, C_{12}, C_{22},$$
$$C_{03}, C_{13}, C_{23},$$
$$C_{04}, C_{14}, C_{24},$$

is successively inputted to the individual multipliers K0, K1, K2 at every time T/4, and the respective multipliers K0, K1, K2 output the following data, as illustrated in FIG. 9, $$X_0 \cdot C_{01}, X_1 \cdot C_{11}, X_2 \cdot C_{21},$$
$$X_0 \cdot C_{02}, X_1 \cdot C_{12}, X_2 \cdot C_{22},$$
$$X_0 \cdot C_{03}, X_1 \cdot C_{13}, X_2 \cdot C_{23},$$
$$X_0 \cdot C_{04}, X_1 \cdot C_{14}, X_2 \cdot C_{24},$$

The adder SUM then successively outputs $Y_{11}$, $Y_{12}$, $Y_{13}$ and $Y_{14}$.

The output data Yij from the digital signal processing block 2 is thereafter applied to the DA converter 4, which converts the data into an analog signal, via the digital output interface 3, and is outputted via the buffer circuit 5.

In a summary of the present invention, a gap between an input digital data series at a sampling period T is compensated for with a plurality of digital data by using the time series numerical value data of a unit pulse response signal, and the compensated data is converted into analog values before the analog signal is outputted through buffer circuits.

Although the embodiment has been explained in the case of n=4 and m=2, any types of time series numerical value data of a unit pulse response signal waveform may be generated by altering n, m and time series numerical value data Cij.

As has been described, according to the present invention, because the DA converter is constructed such that a gap between input digital data is digitally compensated for, and a continuous analog signal is outputted after the compensated data is DA-converted, it is possible, without utilizing a low-pass filter, to obtain a smooth analog signal with little distortion.

Further, according to the present invention, an analog circuit is provided only in a DA converter at the final stage, so that adjustment to the components of the converter is not necessary, thereby providing a DA converter which withstands deterioration with age and temperature.

Moreover, according to the present invention, since all components, except for the DA converter at the final stage, are constructed by digital processing, such as a digital signal processing block, it is possible to miniaturize the converter, and to reduce the number of parts as well as cost. It is further possible to readily and digitally alter the waveform of a unit pulse response signal.

As many apparently widely different embodiments of the present invention can be made without departing from the spirit and scope thereof, it is to be understood that the invention is not limited to the specific embodiment thereof except as defined in the appended claims.

What is claimed is:

1. A digital-to-analog converter comprising:
   a partial signal time series data generating section for delaying a unit pulse response signal into m time-delayed partial signals during a predetermined time interval T, and for digitally and repeatedly generating from each of the m time-delayed partial signals an item of time series numerical value, generating a total of m items of numerical values during every sampling period T/n, wherein n is $>=3$, and thereby generating a total of m*n items of numerical values every time interval T;
   a digital data storing section for storing, while shifting, m digital values of the latest m time-delayed partial signals generated during the predetermined time interval T;
   a digital computing section for multiplying each of the m time series numerical values of each time-delayed partial signal by the digital values stored in said storing section corresponding to each of the m time-delayed partial signals, and for adding the multiplication results, thereby producing one digital sum for every T/n sampling period; and
   a converter for converting said digital sums from the digital computing section into an analog signal.

2. The digital-to-analog converter as recited in claim 1 wherein said digital data storing section comprises a plurality of shift registers coupled to said digital computing section.

3. The digital-to-analog converter as recited in claim 1 further comprising an input interface coupled to said digital data storing section wherein said input interface comprises:
   a bi-phase signal receiving circuit for receiving bi-phase modulated data series;
   a waveform shaping circuit coupled to said bi-phase signal receiving circuit;
   a data format converting circuit coupled to said waveform shaping circuit; and
   a data timing circuit coupled to said data format converting circuit and to said digital data storing section.

4. The digital-to-analog converter as recited in claim 1 further comprising an output interface coupled to said digital computing section wherein said output interface includes a plurality of registers.

5. The digital-to-analog converter as recited in claim 4 wherein said output interface further comprises:
   a decoder coupled to said plurality of registers; and
   a ternary counter coupled to said decoder.

6. The digital-to-analog converter as recited in claim 1 wherein said partial signal time series data generating section, said digital data storing section and said digital computing section are included in a digital signal processor.

7. The digital-to-analog converter as recited in claim 1 wherein said digital data is a digital audio signal provided by a digital audio signal processing apparatus.

8. The digital-to-analog converter as recited in claim 1 wherein said partial signal time series data generating section further comprises:
a memory for storing the time series numerical values; and
means for reading, at every T/n, the time series numerical values of each partial signal at a predetermined time T i/n(i=1,2,... n) and for inputting the time series numerical values to said digital computing section.

9. A digital-to-analog converter comprising:
a partial signal time series data generating section for delaying a unit pulse response signal into m time-delayed partial signals during a predetermined time interval T, and for digitally and repeatedly generating from each of the m time-delayed partial signals an item of time series numerical value, generating a total of m items of numerical values during every sampling period T/n, wherein n is $>=3$, and thereby generating a total of m*n items of numerical values every time interval T;
a digital data storing section for storing, while shifting, m digital values of the latest m time-delayed partial signals generated during the predetermined time interval T;
a digital computing section for multiplying each of the time series numerical values of each time-delayed partial signal by the digital values stored in said storing section corresponding to each of the m time-delayed partial signals, and for adding the multiplication results, thereby producing one digital sum for every T/n sampling period;
a converter for converting said digital sums from the digital computing section into an analog section; and
an input interface coupled to said digital data storing section wherein said input interface comprises:
a bi-phase signal receiving circuit for receiving bi-phase modulated data series;
a waveform shaping circuit coupled to said bi-phase signal receiving circuit; and
a data format converting circuit coupled to said waveform shaping circuit.

10. A method for converting a digital signal into an analog signal comprising the steps of:
delaying a unit pulse response signal into m time-delayed partial signals during a predetermined time interval T, and digitally and repeatedly generating from each of the m time-delayed partial signals an item of time series numerical value, generating a total of m items of numerical values during every sampling period T/n, wherein n is $>=3$, and thereby generating a total of m*n items of numerical values every time interval T;
storing, while shifting, m digital values of the latest m time-delayed partial signals generated during the predetermined time interval T;
multiplying each of the m time series numerical values of each time-delayed partial signals by the digital values corresponding to each of the m time-delayed partial signals, and adding the multiplication results to provide one digital sum every T/n sampling period; and
converting the said digital sums into an analog signal.

* * * * *